United States Patent
Chiu et al.

(10) Patent No.: US 6,867,466 B2
(45) Date of Patent: Mar. 15, 2005

(54) MEMORY DEVICE AND METHOD FOR FORMING A PASSIVATION LAYER THEREON

(75) Inventors: Hung-Yu Chiu, Kaohsiung (TW); U-Way Tseng, Taichung (TW); Wen-Pin Lu, Ilan (TW); Cheng-Chen Huseh, Taipei (TW); Pei-Ren Jeng, Hsinchu (TW); Fu-Hsiang Hsu, Keelung (TW)

(73) Assignee: Macronix International Co., Ltd., Hsin-chu (TW)

( * ) Notice: Subject to any disclaimer, the term of this patent is extended or adjusted under 35 U.S.C. 154(b) by 0 days.

(21) Appl. No.: 10/242,773

(22) Filed: Sep. 13, 2002

(65) Prior Publication Data

US 2003/0173670 A1 Sep. 18, 2003

(30) Foreign Application Priority Data

Mar. 13, 2002 (TW) ........................................ 91104754 A

(51) Int. Cl.$^7$ ............................................... H01L 27/14
(52) U.S. Cl. ....................... 257/411; 257/639; 257/649; 257/760; 438/769; 438/954
(58) Field of Search ................................. 257/411, 639, 257/649, 760; 438/216, 261, 287, 591, 769, 954, 981

(56) References Cited

U.S. PATENT DOCUMENTS

| 5,627,403 A | * | 5/1997 | Bacchetta et al. | .......... 257/639 |
| 5,788,767 A | | 8/1998 | Ko et al. | |
| 5,863,832 A | * | 1/1999 | Doyle et al. | ................ 438/622 |
| 6,051,497 A | * | 4/2000 | Ploessl | ...................... 438/690 |
| 6,472,315 B2 | * | 10/2002 | Nguyen et al. | ............. 438/637 |

FOREIGN PATENT DOCUMENTS

| TW | 318946 | 11/1997 |
| TW | 386293 | 4/2000 |
| TW | 497176 | 8/2002 |

* cited by examiner

Primary Examiner—David Nelms
Assistant Examiner—Long Tran
(74) Attorney, Agent, or Firm—Birch, Stewart, Kolasch & Birch, LLP

(57) ABSTRACT

A memory device with an improved passivation structure. The memory device includes a semiconductor substrate with memory units thereon, an interconnect structure over the surface of the semiconductor substrate to connect with the memory units, and a passivation structure over the surface of the interconnect structure. The passivation structure comprises a dielectric layer over the surface of the interconnect structure and a silicon-oxy-nitride (SiOxNy) layer over the surface of the dielectric layer.

11 Claims, 4 Drawing Sheets

MEMORY DEVICE AND METHOD FOR FORMING A PASSIVATION LAYER THEREON

BACKGROUND OF THE INVENTION

1. Field of the Invention

The present invention relates to semiconductor integrated devices, and more particularly to a memory device with an improved passivation layer and the method for forming the passivation layer on the memory device.

2. Description of the Related Art

Typical semiconductor memory device fabrication forms semiconductor transistors, i.e. memory units, densely on a wafer and multiple metal layers with interconnects formed in electrical contact with the inside circuitry. In addition, a passivation layer is deposited over the entire top surface of the wafer to protect the underlying devices from contamination and moisture or mechanical damage.

The passivation layer is an insulating and protective layer that prevents mechanical and chemical damage during IC assembly and packaging for general semiconductor product. For flash memory, another purpose of the passivation layer is for hydrogen blocking, which is to prevent hydrogen from penetrating the interconnects. Because the floating gate of erasable programmable ROM stores negative charges as data storage, the hydrogen penetration into the interconnects will damage the underlying floating gate and affects the data retention and endurance of the memory device.

Conventionally, silicon nitride (SiN) is chosen as the material for passivation layer. U.S. Pat. No. 5,788,767 discloses a conventional passivation process that results in two separate layers: a silicon nitride layer atop a silicon-oxide layer which is deposited over the top metal of metal interconnects. Another conventional passivation layer is composed of two layers of silicon nitride. The reason to chose silicon nitride as the material for a passivation layer is because silicon nitride provides an impermeable barrier to moisture and mobile impurities, e.g. alkali metal ions. Generally, silicon nitride is deposited by Plasma Enhanced Chemical Vapor Deposition (PECVD) as a major layer of a passivation structure.

However, silicon nitride is not good enough for hydrogen blocking. For flash memory, data retention is seriously affected by the hydrogen penetration through the silicon nitride passivation layer.

BRIEF SUMMARY OF THE INVENTION

To achieve better hydrogen blocking, an object of the present invention is to provide a semiconductor memory device with a passivation layer mainly composed of silicon-oxy-nitride (SiOxNy) and a fabricating method thereof. The passivation layer according to the present invention can protect the underlying semiconductor memory units from hydrogen penetration and degradation.

It is also an object of the present invention to provide a semiconductor memory device with a passivation layer mainly composed of silicon-oxy-nitride (SiOxNy) and a fabricating method thereof to improve the data retention and endurance of the semiconductor memory device.

To achieve the above-mentioned objects, a memory device according to the invention comprises: a semiconductor substrate with memory units thereon, an interconnect structure over the surface of the semiconductor substrate to connect with the memory units, and a passivation layer over the surface of the interconnect structure, wherein the passivation layer comprises a dielectric layer over the surface of the interconnect structure and a silicon-oxy-nitride (SiOxNy) layer over the surface of the dielectric layer.

The memory unit in the memory device according to the invention can be a mask ROM or a flash memory. The memory device can further comprise a dielectric layer, e.g. phosphorous silica glass, over the surface of the silicon-oxy-nitride (SiOxNy) layer. The dielectric layer underlying the silicon-oxy-nitride can be a high-density-plasma-deposited oxide (HDP oxide).

A method for forming a passivation layer on a memory device with an interconnect structure is further provided according to the present invention. The method comprises the following steps. A first dielectric layer is formed over the surface of the interconnect structure. A silicon-oxy-nitride (SiOxNy) layer is then formed over the surface of the first dielectric layer. A second dielectric layer is formed over the surface of the silicon-oxy-nitride layer.

In a preferred embodiment, an oxide is formed by high density plasma chemical vapor deposition (HDPCVD) as the first dielectric layer and the preferred thickness is between 7000 to 10000 Å. The silicon-oxy-nitride (SiOxNy) layer is formed by chemical vapor deposition (CVD) and the thickness is between 4000 to 7000 Å. The second dielectric layer is phosphorous silica glass (PSG) which is formed by atmospheric pressure chemical vapor deposition (APCVD) and the thickness is between 8000 to 10000 Å.

BRIEF DESCRIPTION OF THE DRAWINGS

The present invention will become more fully understood from the detailed description given herein and the accompanying drawings, given by way of illustration only and thus not intended to be limitative of the present invention. In the drawings.

DETAILED DESCRIPTION OF THE INVENTION

The results of seven passivation layer structures comparison are disclosed to show the advantages of the SiON-contained passivation structure of the present invention. The seven passivation structures are formed on memory devices with two layers of metal interconnected structure, which are all composed of the first, second and third layers in sequence over the surface of the metal interconnected structure. The detail structures of the seven passivation layers are listed in Table 1.

TABLE 1

| | inter-metal dielectric layer | the first layer | the second layer | the third layer |
|---|---|---|---|---|
| G1 | HBO 3K | HDP 8K | UV-SiN 4K(AMAT) | PSG 9K |
| G2 | HBO 3K | HDP 8K | SAUSG 7K | SiON(NVLS) 6K |
| G3 | HBO 3K | HDP 8K | SiON(NVLS) 9K | none |
| G4 | HBO 3K | HDP 8K | PE-TEOS 4K | SiON(NVLS) 9K |

TABLE 1-continued

| | inter-metal dielectric layer | the first layer | the second layer | the third layer |
|---|---|---|---|---|
| G5 | HBO 3K | HDP 8K | UV-SiN(NVLS) 4K | PSG 9K |
| G6 | HBO 3K | HDP 8K | SiON(NVLS) 4K | PSG 9K |
| G7 | TEOS 2K | HDP 8K | UV-SiN(AMAT) 4K | PSG 9K |

HBO: hydrogen blocking oxide.
TEOS: tetra-ethyl-ortho-silicate.
HDP: high density plasma deposited oxide.
UV-SiN: UV erasable and re-writable SiN layer.
SiON: silicon-oxy-nitride (SiOxNy) formed by chemical vapor deposition (CVD).
AMAT: a CVD system provided by Applied Materials, Inc.
NVLS: a CVD system provided by Novellus systems, Inc.
PE-TEOS: TEOS oxide formed by Plasma-enhanced CVD.
PSG: phosphorous silica glass formed by atmospheric pressure CVD (APCVD).
SAUSG: sub-atmospheric undoped silica glass formed by sub-atmospheric pressure CVD (SPCVD).

Figure 1:
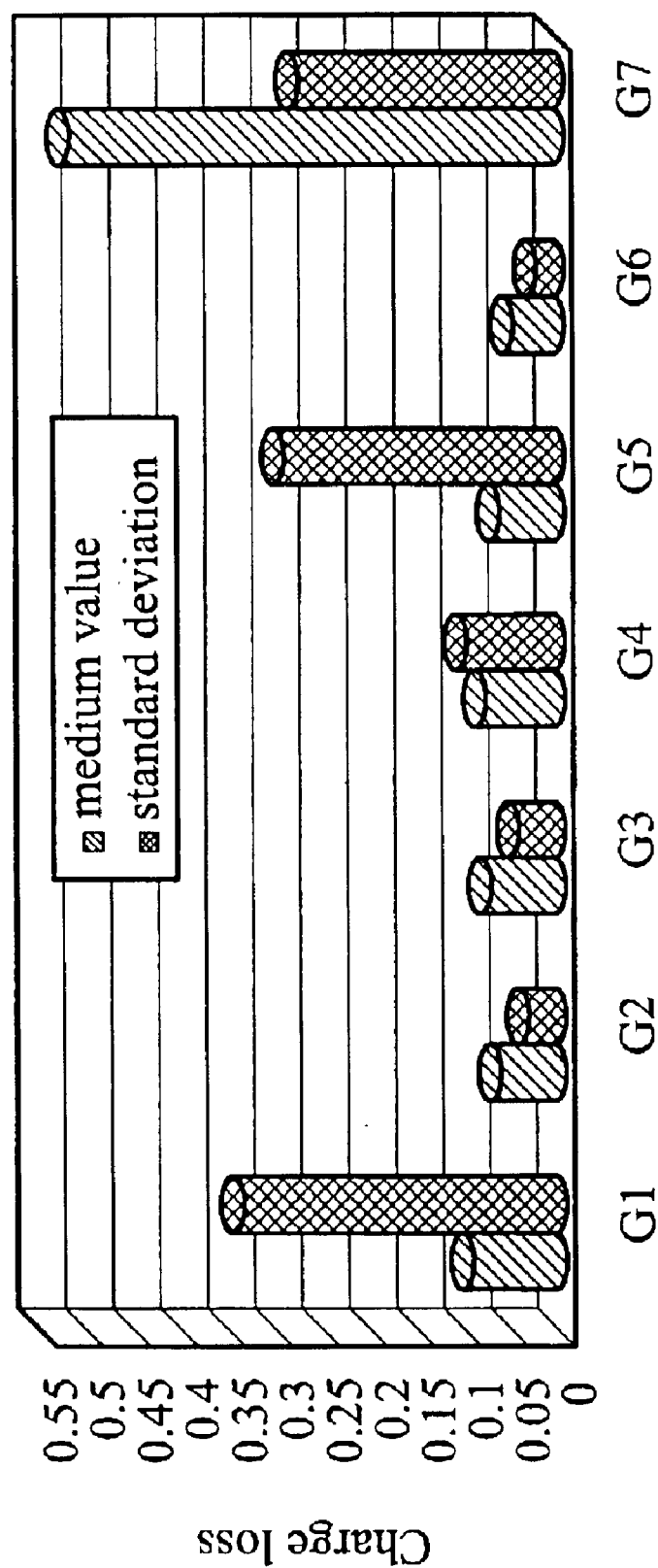
FIG. 1 shows the results of charge loss of seven passivation structures.

Seven wafers covered with the seven passivation structures respectively are baked for 48 hours under 250° C. and then the charge loss, i.e. the charge difference before and after baking, of nineteen points on each wafer, is measured. The medium value and the standard deviation of the measuring data of each wafer are listed in Table 2 and the result comparison is shown in FIG. 1.

TABLE 2

| inter-metal dielectric layer | G1 | G2 | G3 | G4 | G5 | G6 | G7 TEOS 2K |
|---|---|---|---|---|---|---|---|
| | | | HBO 3K | | | | |
| Passivation structure | HDP8K/ UV-SiN 4K(AMAT)/ PSG 9K | HDP8K/ SAUSG 7K/SiON (NVLS) 6K | HDP8K/ SiON(NVLS) 9K | HDP8K/ PE-TEOS 4K/SiON (NVLS) 9K | HDP8K/ UV-SiN 4K(NVLS)/ PSG 9K | HDP8K/ SiON 4K(NVLS)/ PSG 9K | HDP8K/ UV-SiN 4K(AMAT)/ PSG 9K |
| Medium value | 0.102 | 0.069 | 0.079 | 0.096 | 0.076 | 0.060 | 0.532 |
| stdev | 0.340 | 0.039 | 0.047 | 0.108 | 0.308 | 0.044 | 0.286 |

As shown in Table 2, the passivation structures G2, G3, G4 and G6 comprising silicon-oxy-nitride are better than the conventional passivation structures G1 and G7 because of less charge loss. The decrease in charge loss represents the passivation structures comprising silicon-oxy-nitride better suitability for data retention of memory units. According to Table 2, although the medium value of the conventional passivation structure G5 which is mainly composed by SiN is close to those comprising SiON, the standard deviation of G5 is higher, which means the uniformity of SiN is not satisfied. Because the medium value and the standard deviation of the passivation structures G2, G3, G4 and G6 comprising silicon-oxy-nitride (SiON) are small, the passivation structure comprising SiON is better than those comprising SiN. Moreover, according to Table 2, forming the SiN layer with various CVD systems does not improve the characteristics of the SiN as a passivation layer.

According to the results showing in Table 2 and FIG. 1, when silicon-oxy-nitride is chosen as a major layer of the passivation structure instead of conventional SiN, the charge loss is decreased effectively and the data retention of memory unit is improved.

Figure 2A:
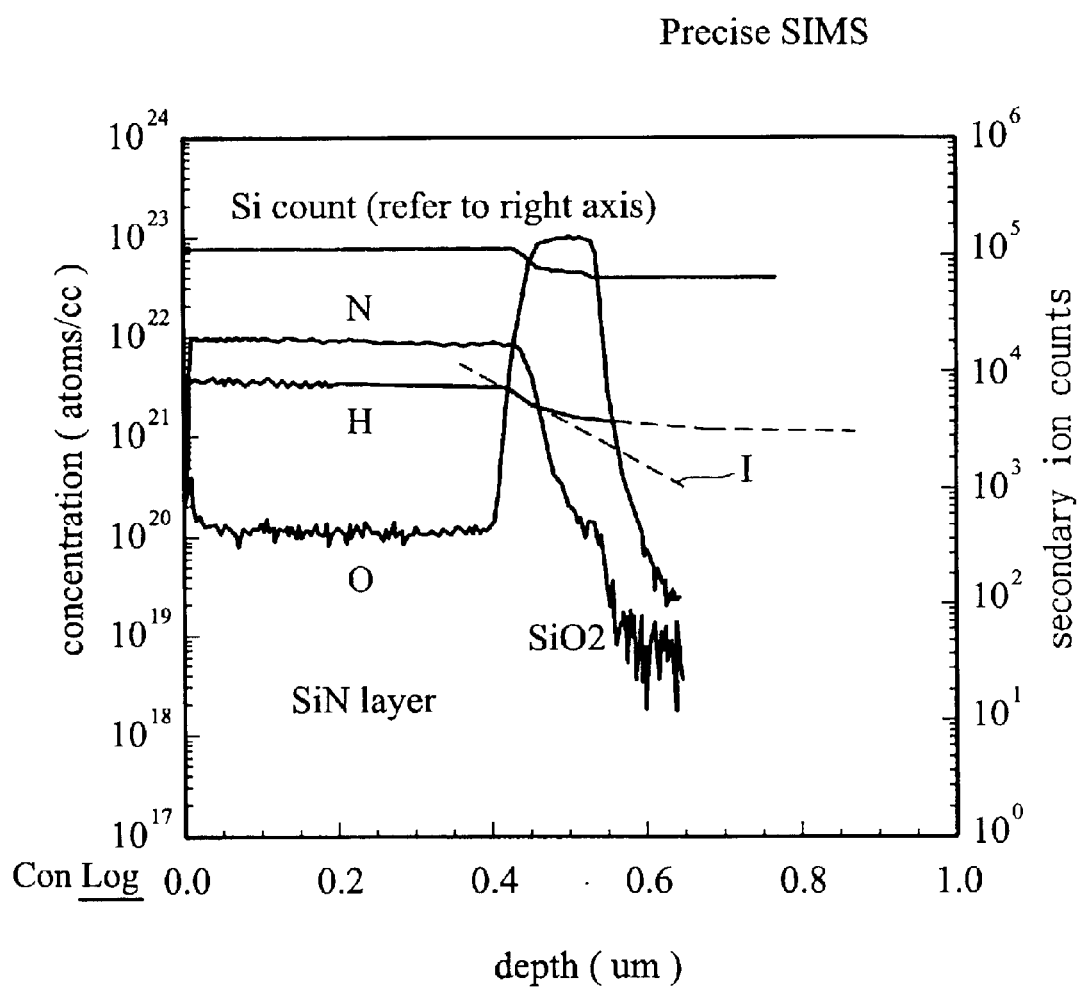
FIGS. 2A and 2B show the SIMS depth profiles of the passivation layers comprising SiN and SiON respectively in one embodiment according to the invention.
Figure 2B:
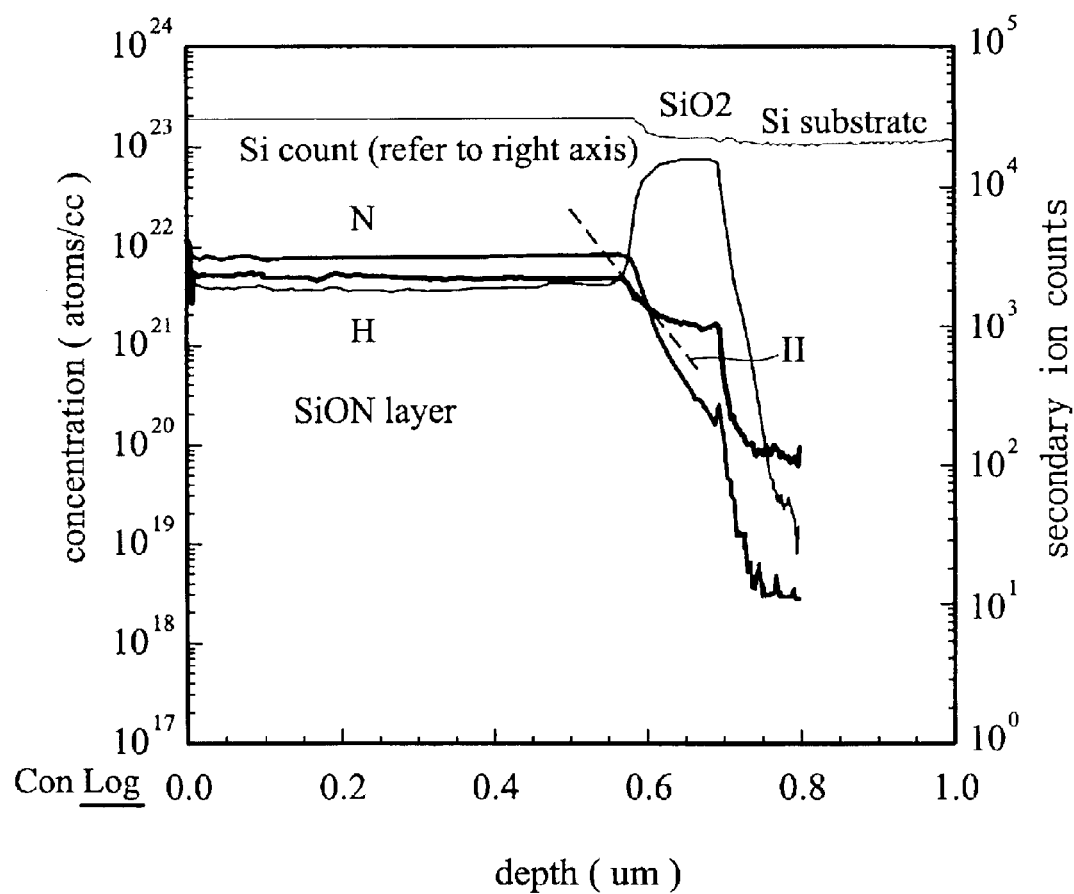

FIGS. 2A and 2B show the SIMS depth profiles of G5 and G6 comprising SiN and SiON respectively. The wafers of G5 and G6 are analyzed by Secondary Ion Mass Spectrometry (SIMS) to obtain corresponding depth profiles. FIG. 2A shows the depth profile of the passivation structure of G5 which comprised SiN and FIG. 2B shows the depth profile of the passivation structure of G6 which comprised SiON.

The slope II of hydrogen in FIG. 2B is greater than the slope I in FIG. 2A, that is, the more rapidly the hydrogen decays, the less hydrogen penetrates through, thus the shallower the penetration depth is when SiON is chosen as a major layer of the passivation structure instead of SiN. Therefore, SiON blocks hydrogen from penetrating to the underlying memory units. Based on the results shown in FIGS. 2A and 2B, data retention and endurance of memory devices are improved by choosing silicon-oxy-nitride as a major layer of the passivation structure.

Figure 3A:
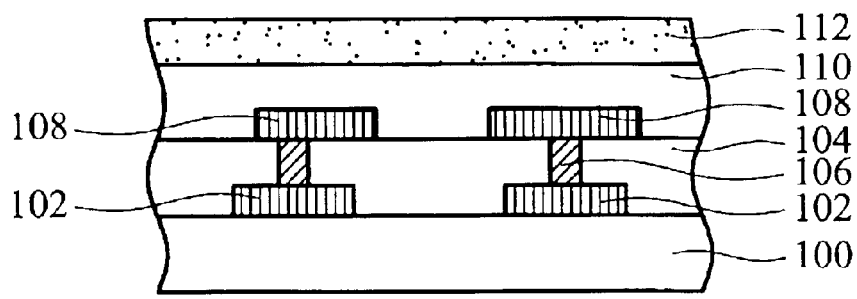
FIGS. 3A~3C illustrate the flow for forming a memory device in one embodiment according to the invention.
Figure 3B:
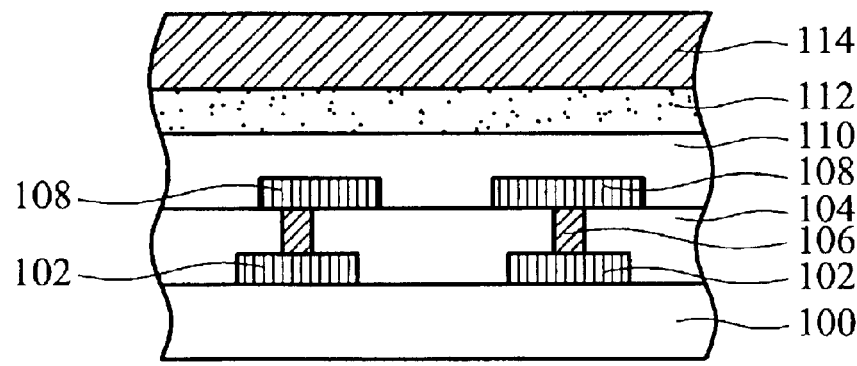
Figure 3C:
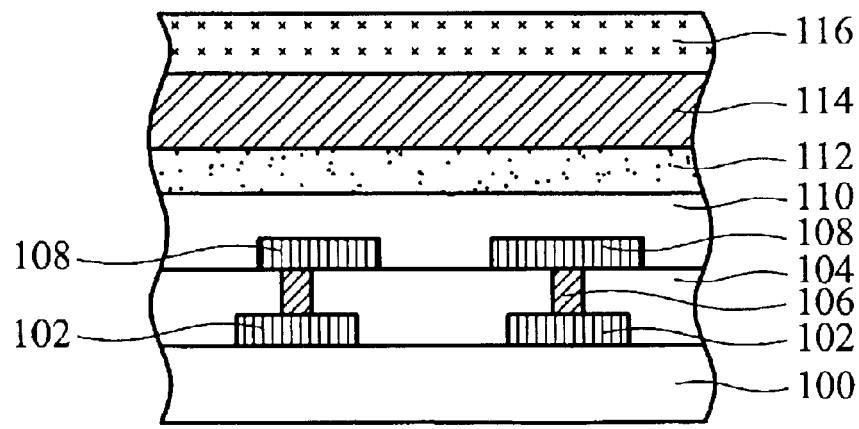

FIGS. 3A~3C illustrate the flow for forming a memory device with a SiON-contained passivation structure in one embodiment according to the invention. Two layers of inter-metal connecting structure are formed over the surface of a semiconductor substrate 100 with memory units (not shown) thereon, as FIG. 3A shows. The preferred memory units on the semiconductor substrate 100 are mask ROMs, erasable programmable ROMs (EPROM) or flash ROMs. The two layers of inter-metal connecting structure comprise the first metal layer 102, the first inter-layered dielectric layer 104, metal plugs 106, the second metal layer 108, and the second inter-layered dielectric layer 110. A first dielectric layer 112 is formed over the surface of the interconnect structure. Preferably, a HDP oxide is formed as the first dielectric layer 112 by high density plasma chemical vapor deposition (HDPCVD) and the thickness is between 7000 to 10000 Å. The more preferred thickness is about 8000 Å. However, the first dielectric layer 112 can be, but is not limited to, TEOS, PE-TEOS, or SAUSG (sub-atmospheric undoped silica glass).

As FIG. 3B shows, a silicon-oxy-nitride layer 114 is formed over the surface of the first dielectric layer 112. The silicon-oxy-nitride layer 114 can be formed by chemical vapor deposition with $SiH_4$: 2455 sccm, $N_2O$: 1500 sccm, RF: 470W and pressure: 1.9 mTorr under 400° C. The preferred thickness of the silicon-oxy-nitride layer 114 is between 4000 to 7000 Å and a more preferred thickness is about 4000 Å.

The interconnect structure and the underlying memory units on the semiconductor substrate 100 can be protected by the upper passivation structure which comprises the first dielectric layer 112 and the silicon-oxy-nitride layer 114 from hydrogen penetration and impurities contamination. Therefore, greater data retention of memory devices is achieved.

In one preferred embodiment, a second dielectric layer 116 is further formed over the silicon-oxy-nitride layer 114 as shown in FIG. 3C. A phosphorous silica glass (PSG) layer can be formed by atmospheric pressure chemical vapor deposition (APCVD) as the second dielectric layer 116 and the preferred thickness is between 8000 to 10000 Å. A more preferred thickness is about 9000 Å. By forming the second dielectric layer 116, e.g. phosphorous silica glass, over the silicon-oxy-nitride layer, the uniformity and smoothness of the surface of the passivation structure is improved and the ratio to pass through the pine hole test is also elevated. The second dielectric layer can also be, but is not limited to, SAUSG.

A memory device formed by the method describing above comprises: a semiconductor substrate 100 with memory units thereon, an interconnect structure (102~110) formed over the surface of the semiconductor substrate 100 and connecting with the underlying memory units, and an upper passivation structure comprising a first dielectric layer 112, e.g. a HDP oxide, and a silicon-oxy-nitride layer 114 over the first dielectric layer 112. A preferred memory device further comprises a second dielectric layer 116, e.g. PSG, over the surface of the silicon-oxy-nitride layer 114 to form a triple-layered passivation structure.

A memory device with a passivation structure comprising silicon-oxy-nitride is obtained by the above method according to the present invention. The hydrogen blocking ability and data retention of the memory device of the present invention is better than conventional memory device comprising SiN. The memory device of the present invention also fits the requirements of electric and material analysis.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory device, comprising:
   a semiconductor substrate with a memory unit thereon;
   an interconnect structure over the surface of the semiconductor substrate to connect the memory unit, the interconnect structure comprising a metal interconnect layer and a substantially planarized hydrogen blocking layer covering the metal interconnect layer; and
   a passivation layer over the surface of the interconnect structure, wherein the passivation layer comprises a first dielectric layer over the surface of the interconnect structure and a silicon-oxy-nitride (SiOxNy) layer over the surface of the first dielectric layer, thereby providing a charge loss in a range of approximately 0.060 to 0.096 and a standard deviation in a range of approximately 0.044 to 0.108.

2. The memory device as claimed in claim 1, further comprising a second dielectric layer over the surface of the silicon-oxy-nitride layer.

3. The memory device as claimed in claim 2, wherein the second dielectric layer is a phosphorus silica glass (PSG) layer.

4. The memory device as claimed in claim 3, wherein the thickness of the phosphorus silica glass layer is between 8000 to 10000 Å.

5. The memory device as claimed in claim 2, wherein the second dielectric layer is a sub-atmospheric undoped silica glass (SAUSG) layer.

6. The memory device as claimed in claim 1, wherein the first dielectric layer is a high density plasma deposited oxide with a thickness between 7000 to 10000 Å.

7. The memory device as claimed in claim 1, wherein the first dielectric layer is tetra-ethyl-ortho-silicate (TEDS), plasma-enhanced TEDS (PE-TEOS), or sub-atmospheric undoped silica glass (SAUSG).

8. The memory device as claimed in claim 1, wherein the thickness of the silicon-oxy-nitride (SiOxNy) layer is between 4000 to 7000 Å.

9. The memory device as claimed in claim 1, wherein the memory unit is a mask ROM unit.

10. The memory device as claimed in claim 1, wherein the memory unit is a flash memory unit.

11. The memory device as claimed in claim 1, wherein the first dielectric layer is thicker than or equal to the Silicon-oxy-nitride (SiOxNy) layer.

* * * * *